(12) United States Patent
Jiang et al.

(10) Patent No.: US 7,866,376 B2
(45) Date of Patent: Jan. 11, 2011

(54) HEAT DISSIPATION DEVICE WITH U-SHAPED AND S-SHAPED HEAT PIPES

(75) Inventors: Lei Jiang, Shenzhen (CN); Dong-Bo Zheng, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 555 days.

(21) Appl. No.: 11/926,701

(22) Filed: Oct. 29, 2007

(65) Prior Publication Data
US 2009/0107653 A1    Apr. 30, 2009

(51) Int. Cl.
F28D 15/00 (2006.01)
H05K 7/20 (2006.01)
H01L 23/34 (2006.01)
F28F 7/00 (2006.01)

(52) U.S. Cl. ............... 165/104.33; 165/80.3; 361/700; 257/715

(58) Field of Classification Search ............ 165/104.33; 361/700; 257/715
See application file for complete search history.

(56) References Cited

U.S. PATENT DOCUMENTS

| | | | |
|---|---|---|---|
| 5,896,922 A * | 4/1999 | Chrysler et al. | 165/165 |
| 5,954,127 A * | 9/1999 | Chrysler et al. | 165/170 |
| 6,625,021 B1 * | 9/2003 | Lofland et al. | 361/697 |
| 7,093,648 B1 * | 8/2006 | Cheng | 165/104.33 |
| 7,609,521 B2 * | 10/2009 | Wu | 361/700 |
| 7,753,109 B2 * | 7/2010 | Min et al. | 165/104.33 |
| 7,779,897 B2 * | 8/2010 | Jin et al. | 165/104.33 |
| 2003/0141041 A1 * | 7/2003 | Chen | 165/80.3 |
| 2006/0032617 A1 * | 2/2006 | Chen et al. | 165/104.33 |
| 2006/0278374 A1 * | 12/2006 | Hao et al. | 165/104.33 |
| 2006/0289150 A1 * | 12/2006 | Lee et al. | 165/104.33 |
| 2007/0000646 A1 * | 1/2007 | Chen et al. | 165/104.33 |
| 2007/0012428 A1 * | 1/2007 | Wu et al. | 165/104.33 |
| 2007/0029072 A1 * | 2/2007 | Lee et al. | 165/104.33 |
| 2007/0074857 A1 | 4/2007 | Xia et al. | |
| 2008/0017351 A1 * | 1/2008 | Zhou et al. | 165/80.3 |

FOREIGN PATENT DOCUMENTS

TW     I265267     11/2006

* cited by examiner

*Primary Examiner*—Cheryl J Tyler
*Assistant Examiner*—Brandon M Rosati
(74) *Attorney, Agent, or Firm*—Jeffrey T. Knapp

(57) ABSTRACT

A heat dissipation device includes a base for contacting an electronic device, a fin set thermally contacting the base, a first heat pipe and a second heat pipe connecting the base and the fin set. The fin set has a bottom larger than the base and an upper portion apart from the bottom thereof. The first heat pipe has a flat top face thermally contacting the bottom of the fin set, including a first transferring portion thermally engaging with the base and a second transferring portion extending from the first transferring portion and projecting beyond the base. The second heat pipe includes an evaporation portion thermally engaging with the base and a condensation portion extending from the evaporation portion and engaging with the upper portion of the fin set.

17 Claims, 3 Drawing Sheets

HEAT DISSIPATION DEVICE WITH U-SHAPED AND S-SHAPED HEAT PIPES

BACKGROUND OF THE INVENTION

1. Field of the Invention

The present invention relates to heat dissipation devices for use in removing heat from electronic devices, and more particularly to a heat dissipation device incorporating heat pipes for improving heat dissipation efficiency of the heat dissipation device.

2. Description of Related Art

During operation of an electronic device such as a computer central processing unit (CPU) mounted on a printed circuit board, a large amount of heat is often produced. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device comprises a solid metal base attached on the CPU, and a plurality of fins arranged on the base. The base is intimately attached to the CPU thereby absorbing the heat generated by the CPU. Most of the heat accumulated at the base is transferred firstly to the fins and then dissipates away from the fins. However, as electronics technology continues to advance, increasing amounts of heat are being generated by powerful state-of-the-art CPUs. As a result, many conventional heat dissipation devices are no longer able to efficiently remove heat from these CPUs.

In order to overcome the above set forth problems, a type of heat dissipation device illustrated as follows can be used. The heat dissipation device comprises a base for absorbing heat from a CPU, a plurality of fins entirely arranged on the base, and a heat pipe thermally connecting the base with an upper portion of the fins. In use, a center of the base contacts the CPU and absorbs heat from the CPU. A part of the heat in the base is directly transferred from the center to other parts of the base. The heat in the whole base spreads to the fins. The other part of the heat in the base is absorbed by the heat pipe, and the heat pipe transfers the heat to the upper portion of the fins. The heat in the fins is dissipated to ambient air. However, only the center of the base contacts and absorbs heat from the CPU. Generally, the base is made of solid metal, which results in that the heat in the center of the base cannot be transmitted to other parts of the base rapidly and evenly. Furthermore, the base is large relative to the CPU, which results in a large weight and increasing cost of the heat dissipation device. Therefore, the heat dissipation device needs to be improved.

What is needed, therefore, is a heat dissipation device has a large heat dissipation capacity for an electronic device.

SUMMARY OF THE INVENTION

A heat dissipation device includes a base for contacting with an electronic device, a fin set thermally contacting the base, a first heat pipe and a second heat pipe connecting the base and the fin set. The fin set has a bottom larger than the base and an upper portion apart from the bottom thereof. The first heat pipe has a flat top face thermally contacting the bottom of the fin set, comprising a first transferring portion thermally engaging with the base, and a second transferring portion extending from the evaporation portion and projecting beyond the base. The second heat pipe comprises an evaporation portion thermally engaging with the base, and a condensation portion extending from the evaporation portion and engaging with the upper portion of the fin set.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
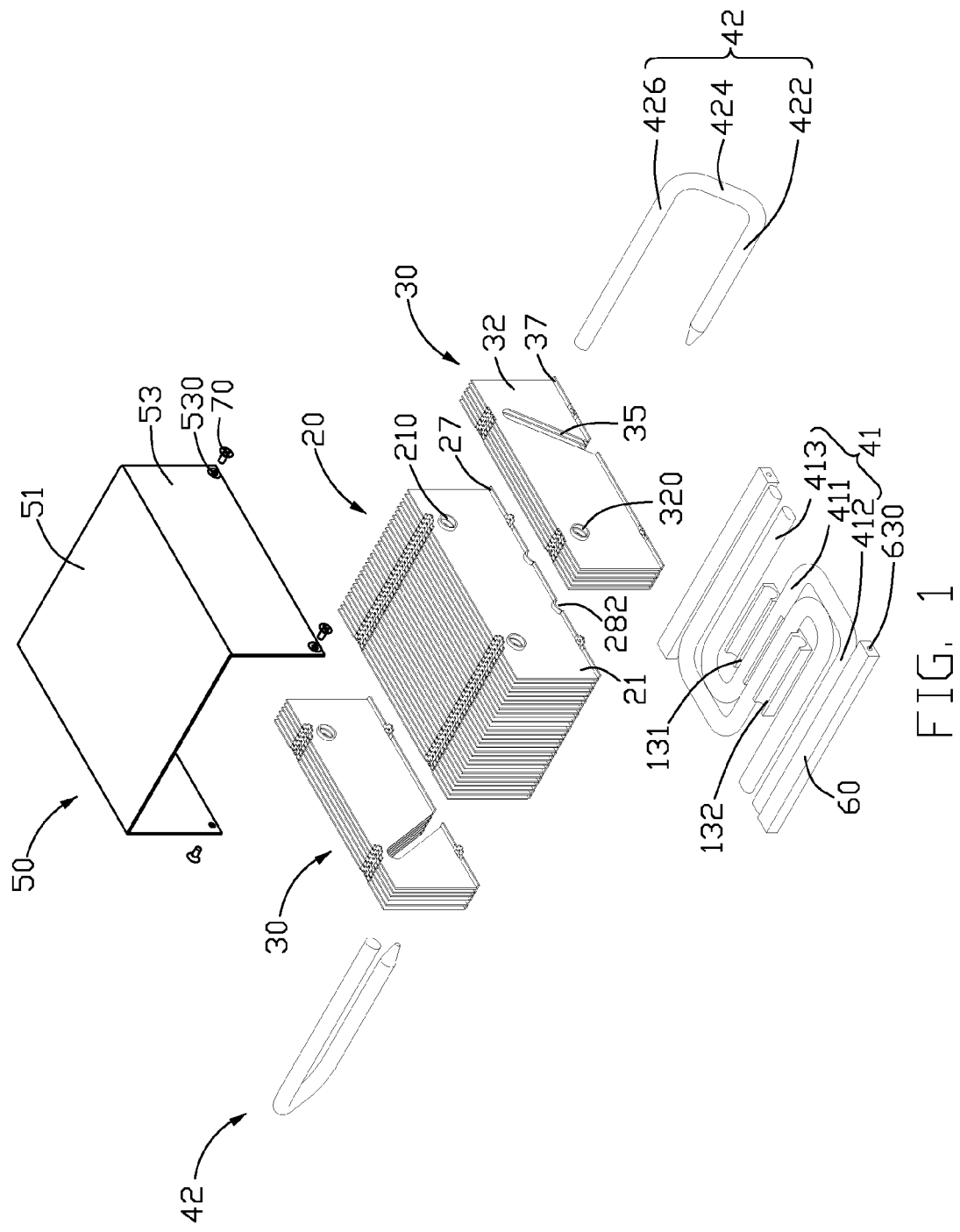
FIG. 1 is an exploded, isometric view of a heat dissipation device in accordance with a preferred embodiment of the present invention.
Figure 2:
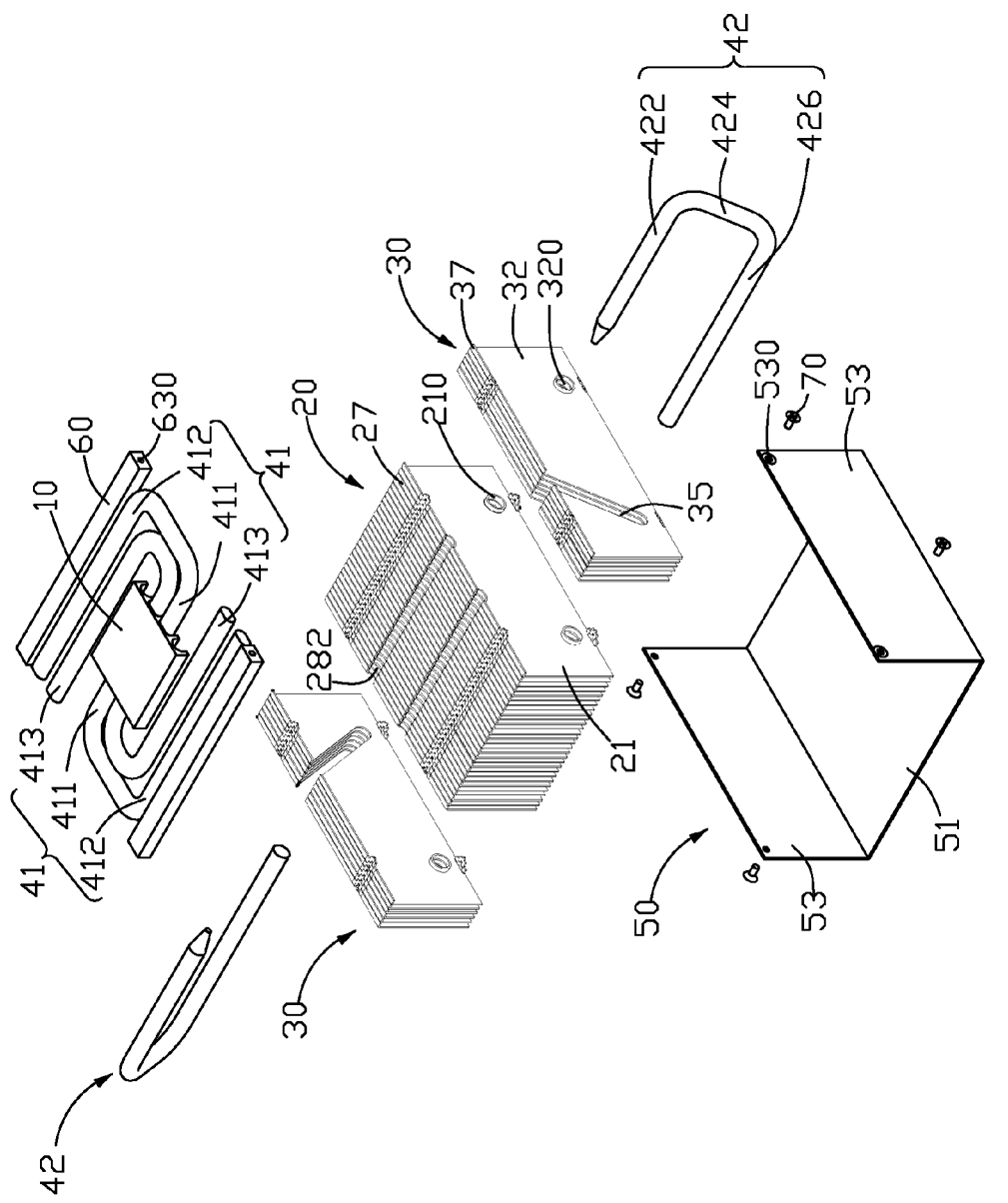
FIG. 2 is an inverted view of FIG. 1.
Figure 3:
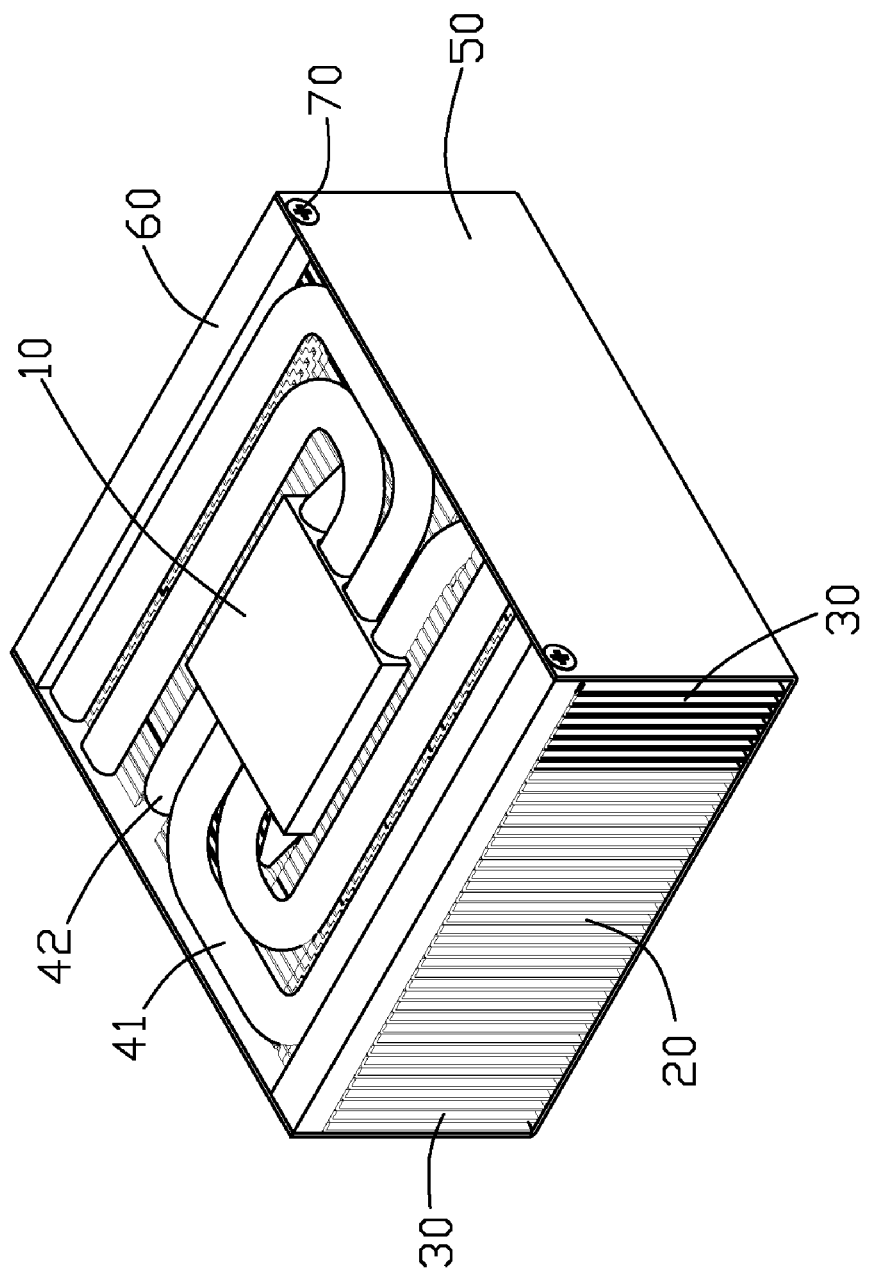
FIG. 3 is an assembled view of FIG. 2.

Referring to FIGS. 1-3, a heat dissipation device in accordance with a preferred embodiment of the present invention is used for dissipating heat generated by an electronic device (not shown) located on a printed circuit board (not shown). The heat dissipation device comprises a base 10, a first fin set 20, two second fin sets 30 sandwiching the first fin set 20 therebetween, two first heat pipes 41 and two second heat pipes 42 thermally connecting with the base 10 and the first and second fin sets 20, 30, and a cover 50 engaged with two supporting members 60 to enclose the first and second fin sets 20, 30 therein.

The base 10 is a substantially rectangular metal plate having good heat conductivity, and has a bottom face (not shown) for contacting the electronic device and a top face (not labeled) opposite to the bottom face. The base 10 defines two parallel straight first grooves 131 each having a flat bottom in a central portion of the top face thereof for receiving the first heat pipes 41. The base 10 further defines two parallel straight second grooves 132 located outside the first grooves 131, for receiving the second heat pipes 42. The first grooves 131 and the second grooves 132 are parallel to each other. In this embodiment, the bottom face of the base 10 has a size equal to or slightly larger than that of the electronic device but less than that of a flat bottom face (not labeled) of the first fin set 20.

The first fin set 20 comprises a plurality of parallel first fins 21 assembled together. Each of the first fins 21 is a thin rectangular metal sheet. Each of the first fins 21 forms a flange 27 perpendicularly extending from a bottom edge thereof. The flanges 27 of the first fins 21 cooperatively form the bottom face of the first fin set 20. Two spaced, parallel straight grooves 282 are defined in the bottom face. Each of the first fins 21 defines two spaced through holes 210 in an upper portion thereof. Each of the through holes 210 is surrounded by a respective annular sidewall (not labeled) extending from a corresponding first fin 21.

The two second fin sets 30 are respectively positioned at two opposite lateral sides of the first fin set 20. Each of the second fin sets 30 comprises a plurality of parallel second fins 32 assembled together. Each of the second fins 30 has a configuration similar to that of the first fins 21 and has a flange 37 at a bottom edge thereof. The flanges 37 of the second fin set 30 form a bottom face. Each of the second fins 32 defines a through hole 320 with an annular sidewall corresponding to one of the two through holes 210 of the first fin 21, and a straight cutout 35. The cutout 35 has top and bottom end portions respectively corresponding to the other one of the two through holes 210 and an adjacent groove 282 of the first fin 21. The cutout 35 is defined at an angle to the flange 37 of each second fin 32, so that the cutout 35 is defined at an angle to the bottom face of the second fin set 30. The cutout 35 is defined through the bottom face of the second fin set 30. The through holes 320 in the second fin sets 30, the top end portions of the cutouts 35 and the through holes 210 in the first fin set 20 cooperatively form two passages for receiving the second heat pipes 42. The cutouts 35 of one second fin set 30 are defined at a lateral side opposite to a lateral side where the cutouts 35 of the other second fin set 30 are defined. The first fins 21 and the second fins 32 respectively form clasps (not labeled) at the top and bottom thereof. The fins 21, 32 snappingly connect with each other via the clasps thereof.

The first heat pipes 41 have flat top faces (not labeled) contacting a bottom of the first fin set 20 and flat bottom faces (not labeled) contacting the base 10. Each of the first heat pipes 41 is substantially S-shaped in profile, and comprises three parallel sections: a first transferring portion 411, a second transferring portion 412 and a third transferring portion 413. The second and third transferring portions 412, 413 connect with two opposite ends of the first transferring portion 411 via two connecting portions (not labeled) in opposite extension directions. A distance between the first transferring portion 411 and the second transferring portion 412 is larger than that between the first transferring portion 411 and the third transferring portion 413.

Each second heat pipe 42 has a U-shaped configuration and comprises an evaporation portion 422, a condensation portion 426 and a connecting portion 424 perpendicularly connecting the evaporation portion 422 and the condensation portion 426. The condensation portion 426 is parallel to the evaporation portion 422 and longer than it. The second heat pipes 42 are so arranged that they are opened to each other when they are assembled in the heat dissipation device.

The cover 50 is used for protecting the first and second fin sets 20, 30, and comprises a rectangular top panel 51 and two rectangular lateral panels 53 extending vertically and downwardly from opposite edges of the top panel 51. Each of the lateral panels 53 defines two through holes 530 in two lower corners thereof. Each supporting member 60 is elongated and has a rectangular cross section. Each supporting member 60 defines two screw holes 630 corresponding to the through holes 530 of the lateral panels 53 of the cover 50.

In assembly, the base 10 and the first heat pipes 41 are soldered with a bottom of the first fin set 20 and second fin sets 30. The first heat pipes 41 are juxtaposed on the bottom face of the first fin set 20 and second fin sets 30. The first transferring portion 411 and the third transferring portion 413 of one first heat pipe 41 are located between the first transferring portion 411 and the second transferring portion 412 of the other first heat pipe 41. The first transferring portions 411 of the first heat pipes 41 are thermally received in the first grooves 131 of the base 10 and the second and third transferring portions 412, 413 project beyond two lateral sides of the base 10. The second grooves 132 of the base 10 and the grooves 282 of the first fin set 20 cooperate to form two passages receiving the evaporation portions 422 of the second heat pipes 42. So, the evaporation portion 422 of the second heat pipe 42 is located between the first transferring portion 411 and the third transferring portion 413 of the first heat pipe 41. The connecting portion 424 of each second heat pipe 42 is received in the cutout 35 of a corresponding second fin set 30. So the second heat pipe 42 is extended from a middle, bottom portion of the first and second fin sets 20, 30 to a lateral, upper portion thereof. The condensation portion 426 of each second heat pipe 42 is inserted into the through holes 210, 320 of the first and second fin sets 20, 30. The supporting members 60 are soldered at two lateral portions of the bottom face of the first and second fin sets 20, 30 and perpendicular to the first and second fins 21, 32. The cover 50 surrounds the first and second fin sets 20, 30 and is mounted to the supporting members 60 via four screw 70 extending through the through holes 530 of the cover 50 and engaging with the screw holes 630 of the supporting member 60.

In use, the base 10 has the bottom face thermally contacting the electronic device to absorb heat generated by the electronic device. The first transferring portions 411 of the first heat pipes 41 and the evaporation portions 422 of the second heat pipes 42, which are located in the top face of the base 10, absorb the heat from the electronic device via the base 10. The heat in the first transferring portions 411 of the first heat pipes 41 is quickly transmitted to all parts of the bottom of the first and second fin sets 20, 30 by the second transferring portions 412 and the third transferring portions 413 of the first heat pipes 41. The heat in the evaporation portion 422 of the second heat pipes 42 is quickly transmitted to an upper portion of the first and second fin sets 20, 30 via the connecting portion 424 and the condensation portion 426 of the second heat pipes 42. The heat in the first and second fin sets 20, 30 is dissipated to ambient air through the first and second fins 21, 32.

According to the preferred embodiment of the present invention, the first, second heat pipes 41, 42 cover most of the top face of the base 10 and spread the heat from the electronic device to all parts of the base 10 rapidly.

According to the preferred embodiment of the present invention, the first heat pipes 41 horizontally transmit the heat from the base 10 to the bottom face of the first fin set 20 and the second fin set 30. The second heat pipes 42 transmit the heat from the base 10 to the upper portion of the first fin set 20 and the second fin set 30. Therefore, the heat generated by the electronic device can be quickly and evenly transferred to the first and second fin sets 20, 30, and heat dissipation efficiency of the heat dissipation device is improved accordingly.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for removing heat from a heat generating electronic device, the heat dissipation device comprising:

a base comprising a top face and a bottom face at opposite sides of the base, the bottom face of the base being adapted for contacting the electronic device and absorbing the heat therefrom;

a fin set comprising a bottom thermally contacting the top face of the base for dissipating the heat in the base and an upper portion apart from the bottom, the bottom of the fin set being larger than the top face of the base;

a first s-shaped heat pipe comprising a first transferring portion thermally and physically engaging with the base, having a first end and a second end, a second transferring portion extending from the first end of the first transferring portion and projecting beyond the base, the first and second transferring portions of the first s-shaped heat pipe each comprising a flat top face contacting thermally and physically the bottom of the fin set for transferring the heat of the base to the entire bottom of the fin set, a third transferring portion, extending from the second end of the first transferring portion, the third transferring portion projecting beyond the base and having a flat top face thermally and physically contacting the bottom of the fin set, the first transferring portion, the second transferring portion, and the third transferring portion are all parallel to each other, all located in the same plane, and are all parallel to the base; and
a second u-shaped heat pipe comprising an evaporation portion thermally and physically engaging with the base and a condensation portion extending from the evaporation portion and thermally and physically engaging with the upper portion of the fin set, the second u-shaped heat pipe being adapted for transferring the heat of the base to the upper portion of the fin set.

2. The heat dissipation device of claim 1, further comprising an additional first heat pipe having a configuration similar to that of the first heat pipe, a first transferring portion and a third transferring portion of the additional first heat pipe being located between the first transferring portion and the second transferring portion of the first heat pipe, the first and third transferring portions of the first heat pipe being located between the first transferring portion and a second transferring portion of the additional first heat pipe.

3. The heat dissipation device of claim 1, wherein a distance between the first transferring portion and the second transferring portion of the first heat pipe is larger than that between the first transferring portion and the third transferring portion of the first heat pipe.

4. The heat dissipation device of claim 1, wherein the evaporation portion of the second heat pipe is located between the first transferring portion and the second transferring portion of the first heat pipe.

5. The heat dissipation device of claim 1, wherein the second heat pipe further comprises a connecting portion connecting the evaporation portion and the condensation portion, the second heat pipe having a U-shaped configuration.

6. The heat dissipation device of claim 5, wherein the fin set comprises a plurality of parallel fins assembled together, lateral ones of the fins together defining a slantwise cutout extending from a middle of the bottom of the fin set outwardly to the upper portion of the fin set, the cutout receiving the connecting portion of the second heat pipe therein.

7. The heat dissipation device of claim 1, further comprising two supporting members and a cover engaging with the two supporting members for enclosing the fin set, wherein the two supporting members are soldered to the bottom of the fin set and sandwich the first heat pipe therebetween.

8. A heat dissipation device for removing heat from a heat generating electronic device, the heat dissipation device comprising:
a base for contacting the electronic device;
a fin set having a bottom thermally contacting the base and an upper portion apart from the bottom thereof, the fin set defining a cutout in a lateral portion thereof, the cutout extending from the bottom toward the upper portion of the fin set;
a first heat pipe comprising a first s-shaped transferring portion thermally and physically engaging with the base and a second transferring portion extending from the first transferring portion and projecting beyond the base, the first and second transferring portions of the first s-shaped heat pipe each having a flat top face thermally and physically contacting the bottom of the fin set for transferring the heat of the base to the entire bottom of the fin set, a third transferring portion, extending from the second end of the first transferring portion, the third transferring portion projecting beyond the base and having a flat top face thermally and physically contacting the bottom of the fin set, the first transferring portion, the second transferring portion, and the third transferring portion are all parallel to each other, all located in the same plane, and are all parallel to the base; and
a second u-shaped heat pipe comprising an evaporation portion thermally and physically engaging in the base, a condensation portion thermally and physically engaging with the upper portion of the fin set, and a connecting portion connecting the evaporation portion and the condensation portion and received in the cutout of the fin set.

9. The heat dissipation device of claim 8, wherein the cutout is defined at an angle with the bottom of the fin set.

10. The heat dissipation device of claim 8, wherein the cutout is slantwise and defined from a middle of the bottom of the fin set outwardly to the upper portion of the fin set.

11. The heat dissipation device of claim 8, wherein the fin set defines a passage with annular sidewalls in the upper portion thereof for thermally receiving the condensation portion of the second heat pipe.

12. The heat dissipation device of claim 8, further comprising an additional second heat pipe, the additional second heat pipe comprising an evaporation portion thermally engaging in the base, a condensation portion engaging with the upper portion of the fin set, and a connecting portion connecting the evaporation portion and the condensation portion and received in a cutout in another lateral portion of the fin set.

13. The heat dissipation device of claim 12, wherein the second heat pipe and the additional second heat pipe each are U-shaped, the second heat pipe and the additional heat pipe being so arranged that they are opened to each other.

14. The heat dissipation device of claim 8, further comprising two supporting members and a cover engaging with the two supporting members for enclosing the fin set, the two supporting members being soldered to the bottom of the fin set, the base and the first heat pipe being located between the two supporting members.

15. A heat dissipation device, comprising:
a base having a bottom face adapted for contacting a heat generating electronic component and a top face;
a fin set having a bottom face mounted on the top face of the base and an upper portion distant from the bottom face of the fin set;
a first s-shaped heat pipe comprising a first transferring portion thermally and physically engaging the base, having a first end and a second end, a second transferring portion extending from the first end of the first transferring portion and projecting beyond the base, the first and second transferring portions of the first s-shaped heat pipe comprising a flat top face thermally and physically contacting the bottom of the fin set for transferring the heat of the base to the entire bottom of the fin set, a third transferring portion, extending from the second end of the first transferring portion, the third transferring portion projecting beyond the base and having a flat top face thermally and physically contacting the bottom of the fin set, the first transferring portion, the second transferring portion, and the third transferring portion are all parallel to each other, all located in the same plane, and are all parallel to the base; and
a second u-shaped heat pipe having an evaporating portion thermally and physically engaging with the top face of the base and a condensing portion thermally and physically engaging with the upper portion of the fin set, wherein the second u-shaped heat pipe absorbs the heat of the base and transfers the heat to the upper portion of the fin set.

16. The heat dissipation device of claim 15, wherein a cutout is slantwise and outwardly extended from the bottom face of the fin set to the upper portion of the fin set, and the second heat pipe is U-shaped and has a connecting portion between the evaporating portion and the condensing portion, the connecting portion being received in the cutout.

17. The heat dissipation device of claim 16, further comprising a cover receiving the fin set therein, the cover having a top panel over the fin set and two lateral panels extending downwardly from two opposite edges of the top panel and covering two lateral sides of the fin set.

* * * * *